(12) United States Patent
Chen

(10) Patent No.: US 10,868,098 B2
(45) Date of Patent: Dec. 15, 2020

(54) OLED DISPLAY PANEL AND OLED DISPLAY

(71) Applicant: Wuhan China Star Optoelectronics Semiconductor Display Technology Co., Ltd., Wuhan (CN)

(72) Inventor: Caiqin Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 15 days.

(21) Appl. No.: 16/311,691

(22) PCT Filed: Aug. 14, 2018

(86) PCT No.: PCT/CN2018/100465
§ 371 (c)(1),
(2) Date: Dec. 20, 2018

(87) PCT Pub. No.: WO2019/227682
PCT Pub. Date: Dec. 5, 2019

(65) Prior Publication Data
US 2020/0127071 A1     Apr. 23, 2020

(30) Foreign Application Priority Data
May 31, 2018   (CN) .......................... 2018 1 0549841

(51) Int. Cl.
*H01L 27/32* (2006.01)
*H01L 51/52* (2006.01)
*H01L 51/56* (2006.01)

(52) U.S. Cl.
CPC ...... *H01L 27/3265* (2013.01); *H01L 51/5212* (2013.01); *H01L 51/5228* (2013.01); *H01L 51/56* (2013.01); *H01L 2227/323* (2013.01)

(58) Field of Classification Search
CPC . H01L 27/3265; H01L 51/56; H01L 51/5212; H01L 51/5228; H01L 2227/323
USPC .......................................................... 257/40
See application file for complete search history.

(56) References Cited

U.S. PATENT DOCUMENTS

| 9,548,024 B2 | 1/2017 | Li et al. |
| 9,673,267 B2 * | 6/2017 | Kim .................. H01L 27/3262 |
| 2012/0325406 A1 | 12/2012 | Carducci et al. |
| 2015/0171151 A1 * | 6/2015 | Chae .................. H01L 27/3262 |
| | | 257/40 |
| 2018/0158405 A1 * | 6/2018 | Agostinelli .......... G09G 3/3233 |

FOREIGN PATENT DOCUMENTS

| CN | 103402299 | 11/2013 |
| CN | 107481938 | 12/2017 |

* cited by examiner

Primary Examiner — Vu A Vu

(57) ABSTRACT

An OLED display panel and an OLED display are provided. The OLED display panel includes a substrate, and a first gate electrode layer, a source drain (SD) metal layer, and an anode metal layer that are disposed on the substrate. The first gate electrode layer faces a part of the SD metal layer and/or a part of the anode metal layer to form a compensating capacitor therebetween. This is beneficial in a reduction in process flow.

13 Claims, 2 Drawing Sheets

OLED DISPLAY PANEL AND OLED DISPLAY

RELATED APPLICATIONS

This application is a National Phase of PCT Patent Application No. PCT/CN2018/100465 having International filing date of Aug. 14, 2018, which claims the benefit of priority of Chinese Patent Application No. 201810549841.6 filed on May 31, 2018. The contents of the above applications are all incorporated by reference as if fully set forth herein in their entirety.

FIELD AND BACKGROUND OF THE INVENTION

The present disclosure relates to display technologies, and more particularly, to an organic light emitting diode (OLED) display panel and an OLED display.

In a display region of an active-matrix organic light emitting diode (AMOLED) display device, pixels are arranged into a matrix form including a plurality of rows and a plurality of columns. Each pixel is usually made up of two thin-film transistors and one capacitor, generally called a 2T1C circuit. The 2T1C design is sensitive to the following factors: threshold voltage (Vth) and channel mobility of the TFTs, starting voltage and quantum efficiency of the OLEDs, and transients of power supply. Accordingly, compensating circuits such as 7T1C, 6T1C, and 6T2C, are generally adopted to reduce the impacts.

In the compensating circuits used in the pixels, capacitors are used to keep the potential to drive the TFT and compensate the potential. A compensating capacitor formed between two gate electrode layers is generally used in this field. However, the use of two gate electrode layers makes process flow become more complicated, and this is not good at decreasing cost.

Therefore, there is a need to improve the drawbacks in the existing arts.

SUMMARY OF THE INVENTION

The objective of the present disclosure is to provide an OLED display panel and an OLED display, which is beneficial in a reduction in process flow.

The embodiments of the present disclosure provide an OLED display panel, including a substrate, and a first gate electrode layer, a source drain (SD) metal layer, and an anode metal layer that are disposed on the substrate;

the first gate electrode layer faces a part of the SD metal layer and/or a part of the anode metal layer to form a compensating capacitor therebetween;

the SD metal layer forms a source electrode, a drain electrode, and a first metal member that are separated from each other, and the first metal member faces the first gate electrode layer to form a first compensating capacitor therebetween;

the anode metal layer includes an anode metal and a second metal member that are separated from each other, and the second metal member faces the first gate electrode layer to form a third compensating capacitor therebetween.

In the OLED display panel of the present disclosure, the SD metal layer forms the source electrode, the drain electrode, and the first metal member that are separated from each other, the anode metal layer includes the anode metal and the second metal member that are separated from each other; the first metal member faces the second metal member to form a second compensating capacitor therebetween.

In the OLED display panel of the present disclosure, the OLED display panel further includes a first insulating layer, a second insulating layer, a polycrystalline silicon layer, a third insulating layer, a fourth insulating layer, and a fifth insulating layer;

the first insulating layer is disposed on the substrate, the polycrystalline silicon layer is disposed on the first insulating layer, and the second insulating layer is disposed on the polycrystalline silicon layer and the first insulating layer;

the first gate electrode layer is disposed on the second insulating layer, the third insulating layer is disposed on the first gate electrode layer and the second insulating layer, the SD metal layer is disposed on the third insulating layer, the fourth insulating layer is disposed on the SD metal layer and the third insulating layer, the anode metal layer is disposed on the fourth insulating layer, and the fifth insulating layer is disposed on the anode metal layer and the fourth insulating layer.

In the OLED display panel of the present disclosure, a source electrode via and a drain electrode via are disposed in the second insulating layer and the third insulating layer, the source electrode of the SD metal layer is electrically connected to the polycrystalline silicon layer through the source electrode via, and the drain electrode of the SD metal layer is electrically connected to the polycrystalline silicon layer through the drain electrode via.

In the OLED display panel of the present disclosure, an anode via is disposed in the fourth insulating layer, and the anode metal layer is electrically connected to the SD metal layer through the anode via.

In the OLED display panel of the present disclosure, the fifth insulating layer is perforated to form a first via;

the OLED display panel further includes a light emitting layer and a cathode layer;

the light emitting layer is disposed on the fifth insulating layer and the cathode layer is disposed on the light emitting layer;

the light emitting layer is electrically connected to the anode metal layer through the first via.

In the OLED display panel of the present disclosure, the first insulating layer, the second insulating layer, the third insulating layer, the fourth insulating layer, and the fifth insulating layer can be a silicon dioxide layer or a silicon nitride layer.

The embodiments of the present disclosure further provide an OLED display panel, including a substrate, and a first gate electrode layer, a source drain (SD) metal layer, and an anode metal layer that are disposed on the substrate;

the first gate electrode layer faces a part of the SD metal layer and/or a part of the anode metal layer to form a compensating capacitor therebetween.

In the OLED display panel of the present disclosure, the SD metal layer forms a source electrode, a drain electrode, and a first metal member that are separated from each other, and the first metal member faces the first gate electrode layer to form a first compensating capacitor therebetween.

In the OLED display panel of the present disclosure, the SD metal layer forms the source electrode, the drain electrode, and the first metal member that are separated from each other, the anode metal layer includes the anode metal and the second metal member that are separated from each other;

the first metal member faces the second metal member to form a second compensating capacitor therebetween.

In the OLED display panel of the present disclosure, the anode metal layer includes an anode metal and a second metal member that are separated from each other, and the second metal member faces the first gate electrode layer to form a third compensating capacitor therebetween.

The first metal member faces the second metal member to form a third compensating capacitor therebetween.

In the OLED display panel of the present disclosure, the OLED display panel further includes a first insulating layer, a second insulating layer, a polycrystalline silicon layer, a third insulating layer, a fourth insulating layer, and a fifth insulating layer;

the first insulating layer is disposed on the substrate, the polycrystalline silicon layer is disposed on the first insulating layer, and the second insulating layer is disposed on the polycrystalline silicon layer and the first insulating layer;

the first gate electrode layer is disposed on the second insulating layer, the third insulating layer is disposed on the first gate electrode layer and the second insulating layer, the SD metal layer is disposed on the third insulating layer, the fourth insulating layer is disposed on the SD metal layer and the third insulating layer, the anode metal layer is disposed on the fourth insulating layer, and the fifth insulating layer is disposed on the anode metal layer and the fourth insulating layer.

In the OLED display panel of the present disclosure, a source electrode via and a drain electrode via are disposed in the second insulating layer and the third insulating layer, the source electrode of the SD metal layer is electrically connected to the polycrystalline silicon layer through the source electrode via, and the drain electrode of the SD metal layer is electrically connected to the polycrystalline silicon layer through the drain electrode via.

In the OLED display panel of the present disclosure, an anode via is disposed in the fourth insulating layer, and the anode metal layer is electrically connected to the SD metal layer through the anode via.

In the OLED display panel of the present disclosure, the fifth insulating layer is perforated to form a first via;

the OLED display panel further includes a light emitting layer and a cathode layer;

the light emitting layer is disposed on the fifth insulating layer and the cathode layer is disposed on the light emitting layer;

the light emitting layer is electrically connected to the anode metal layer through the first via.

In the OLED display panel of the present disclosure, the first insulating layer, the second insulating layer, the third insulating layer, the fourth insulating layer, and the fifth insulating layer can be a silicon dioxide layer or a silicon nitride layer.

An OLED display includes an OLED display panel, the OLED display panel including:

a substrate, and a first gate electrode layer, a source drain (SD) metal layer, and an anode metal layer that are disposed on the substrate;

the first gate electrode layer faces a part of the SD metal layer and/or a part of the anode metal layer to form a compensating capacitor therebetween.

In the OLED display of the present disclosure, the SD metal layer forms a source electrode, a drain electrode, and a first metal member that are separated from each other, and the first metal member faces the first gate electrode layer to form a first compensating capacitor therebetween.

In the OLED display of the present disclosure, the SD metal layer forms the source electrode, the drain electrode, and the first metal member that are separated from each other, the anode metal layer includes the anode metal and the second metal member that are separated from each other;

the first metal member faces the second metal member to form a second compensating capacitor therebetween.

In the OLED display of the present disclosure, the anode metal layer includes an anode metal and a second metal member that are separated from each other, and the second metal member faces the first gate electrode layer to form a third compensating capacitor therebetween.

In the present disclosure, the first gate electrode layer faces a part of the SD metal layer and/or a part of the anode metal layer to form a compensating capacitor therebetween. Accordingly, it does need two gate electrode layers to form the compensating capacitor. The present disclosure is beneficial in a reduction in process flow.

DESCRIPTION OF SPECIFIC EMBODIMENTS OF THE INVENTION

Figure 1:
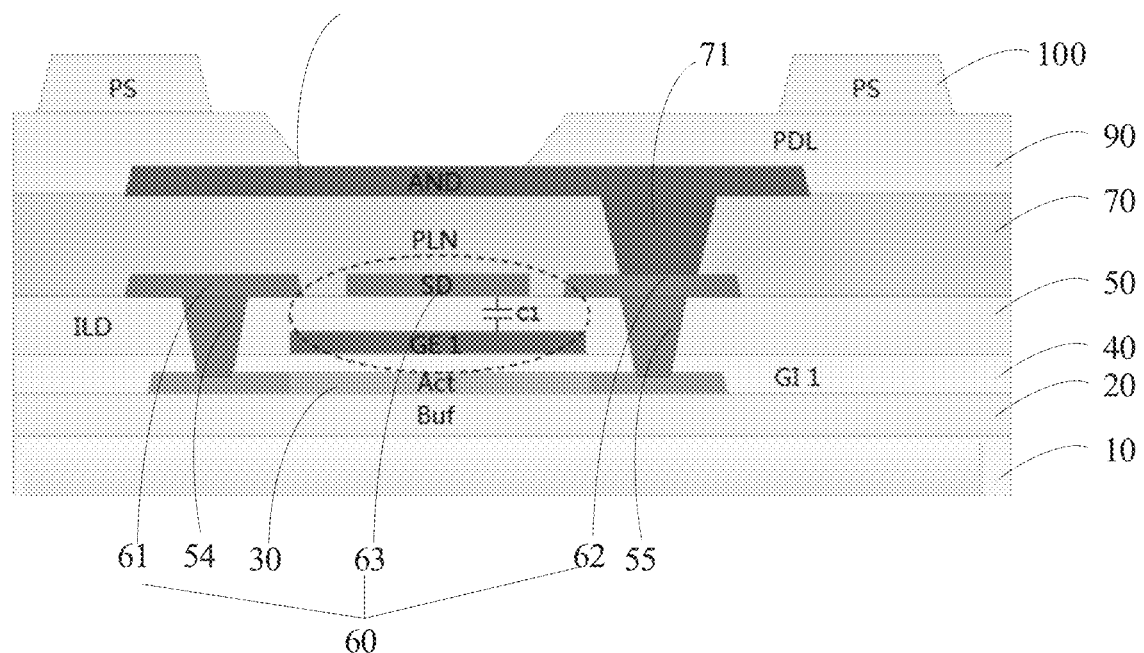
FIG. 1 is a structural diagram showing an existing AMOLED display device.

The embodiments of the present disclosure will be described in detail below. The embodiments are illustrated in the appending drawings, in which the same or similar reference numbers are throughout referred to as the same or similar components or the components having the same or similar functions. The embodiments described below with reference to the appending drawings are exemplary and are merely used to illustrate the present disclosure, and should not be construed as limitations of the present disclosure.

In the description of the present disclosure, it is to be understood that the terms "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicated orientation or positional relationship based on the relationship of the position or orientation shown in the drawings, which is only for the purpose of facilitating describing the description and simplifying the description, but is not intended or implied that the device or element referred to must have a specific orientation, and be constructed and operated in a particular orientation. Therefore, it should not be understood as a limitation of the present disclosure. In addition, the terms "first" and "second" are used for descriptive purposes only, and should not be taken to indicate or imply relative importance, or implicitly indicate the indicated number of technical features. Thus, by defining a "first", and a "second" features may explicitly or implicitly include one or more of the features. In the description of the present disclosure, a "plurality" means two or more, in particular, unless explicitly defined.

In the present disclosure, it should be noted that unless otherwise explicitly specified or limited, the terms "installed", the "connected", and "connection" should be construed broadly, for example, a fixed connection, a removable connection, integrally connected. These terms may be a mechanical connection, and may also be an electrical connection or communication. Moreover, these terms can be directly attached, be indirectly connected through an intermediate medium, and may be internally communicated with two components or the interaction relationship between two components. For persons skilled in the art, they can understand the specific meaning of the terms in the present disclosure based on specific conditions.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above" or "on top of" a second feature may include an embodiment in which the first feature is right or obliquely "on," "above" or "on top of" the second feature, or just means that the first feature is at a height higher than that of the second feature; while a first feature "below," "under" or "on bottom of" a second feature may include an embodiment in which the first feature is right or obliquely "below," "under" or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

The present disclosure provides an organic light emitting diode (OLED) display panel. The OLED display panel includes a substrate, and a first gate electrode layer, a source drain (SD) metal layer, and an anode metal layer that are disposed on the substrate. The first gate electrode layer faces a part of the SD metal layer and/or a part of the anode metal layer to form a compensating capacitor therebetween.

FIG. 1 is a structural diagram showing an OLED display panel according to some embodiments of the present disclosure. The OLED display panel includes a substrate 10, a first insulating layer 20, a polycrystalline silicon layer 30, a second insulating layer 40, a first gate electrode layer GE1, a third insulating layer 50, a SD metal layer 60, a fourth insulating layer 70, an anode metal layer 80, a fifth insulating layer 90, a photoresist spacer (PS) layer 100, a light emitting layer (not shown), and an cathode layer (not shown).

The first insulating layer 20 is disposed on the substrate 10. The polycrystalline silicon layer 30 is disposed on the first insulating layer 20. The second insulating layer 40 is disposed on the polycrystalline silicon layer 30 and the first insulating layer. The first gate electrode layer GE1 is disposed on the second insulating layer 40. The third insulating layer 50 is disposed on the first gate electrode layer GE1 and the second insulating layer 40. The SD metal layer 60 is disposed on the third insulating layer 50. The fourth insulating layer 70 is disposed on the SD metal layer 60 and the third insulating layer 50. The anode metal layer 80 is disposed on the fourth insulating layer 70. The fifth insulating layer 90 is disposed on the anode metal layer 80 and the fourth insulating layer 70. The PS layer is disposed on the fifth insulating layer. The light emitting layer and the cathode layer are sequentially disposed on the fifth insulating layer and the PS layer.

The substrate 10 is a flexible substrate or a glass substrate.

The first insulating layer 20 is a buffer layer, which can be a silicon nitride layer or a silicon dioxide layer. The first insulating layer 20 is deposited on the substrate 10 using chemical vapor deposition.

The polycrystalline silicon layer 30 has an undoped region located at a central portion, and doped regions located at two sides of the undoped region.

The second insulating layer 40 is a separating layer, which can be a silicon nitride layer or a silicon dioxide layer. The second insulating layer 40 is deposited on the polycrystalline silicon layer 30 and the first insulating layer 20 using chemical vapor deposition.

The first gate electrode layer GE1 is made of a transparent conductive metal such as indium tin oxide (ITO).

The third insulating layer 50 is a medium interlayer, which can be a silicon nitride layer or a silicon dioxide layer. The third insulating layer 50 is deposited on the first gate electrode layer GE1 and the second insulating layer 40 using chemical vapor deposition.

The SD metal layer 60 is made of a transparent conductive metal such as indium tin oxide (ITO). The SD metal layer 60 forms a source electrode 61, a drain electrode 62, and a first metal member 63 that are separated from each other. The first metal member 63 faces the first gate electrode layer GE1 to form a first compensating capacitor C1 therebetween.

The fourth insulating layer 70 and the fifth insulating layer 90 can be a silicon nitride layer or a silicon dioxide layer and are formed by deposition using chemical vapor deposition.

The anode metal layer 80 is made of a transparent conductive metal such as indium tin oxide (ITO).

A drain electrode via 54 and a source electrode via 55 are disposed in the second insulating layer and the third insulating layer. The source electrode of the SI) metal layer is electrically connected to the polycrystalline silicon layer through the source electrode via 55. The drain electrode of the SD metal layer is electrically connected to the polycrystalline silicon layer through the drain electrode via 54. An anode via 71 is disposed in the fourth insulating layer. The anode metal layer is electrically connected to the SD metal layer through the anode via 71. The fifth insulating layer is perforated to form a first via. The light emitting layer is electrically connected to the anode metal layer through the first via.

Figure 2:
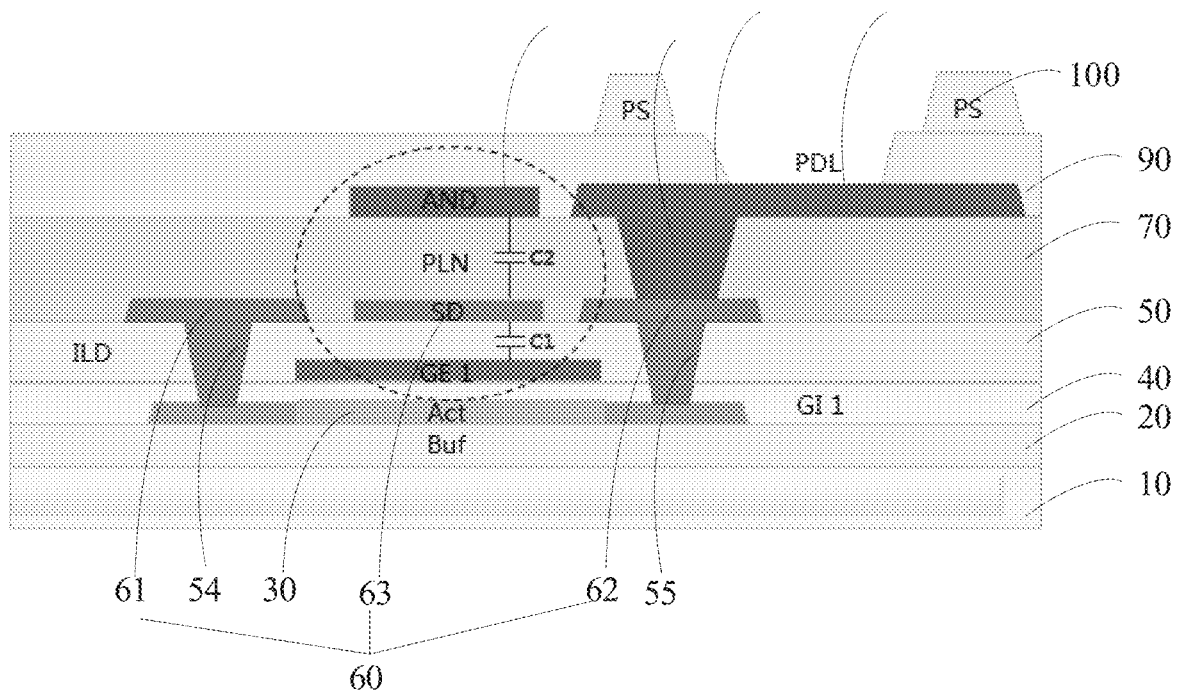
FIG. 2 is a structural diagram showing an existing AMOLED display.

FIG. 2 is a structural diagram showing an OLED display panel according to some embodiments of the present disclosure. The OLED display panel includes a substrate 10, a first insulating layer 20, a polycrystalline silicon layer 30, a second insulating layer 40, a first gate electrode layer GE1, a third insulating layer 50, a SD metal layer 60, a fourth insulating layer 70, an anode metal layer 80, a fifth insulating layer 90, a photoresist spacer (PS) layer 100, a light emitting layer (not shown), and an cathode layer (not shown).

The first insulating layer 20 is disposed on the substrate 10. The polycrystalline silicon layer 30 is disposed on the first insulating layer 20. The second insulating layer 40 is disposed on the polycrystalline silicon layer 30 and the first insulating layer. The first gate electrode layer GE1 is disposed on the second insulating layer 40. The third insulating layer 50 is disposed on the first gate electrode layer GE1 and the second insulating layer 40. The SD metal layer 60 is disposed on the third insulating layer 50. The fourth insulating layer 70 is disposed on the SD metal layer 60 and the third insulating layer 50. The anode metal layer 80 is disposed on the fourth insulating layer 70. The fifth insulating layer 90 is disposed on the anode metal layer 80 and the fourth insulating layer 70. The PS layer is disposed on the fifth insulating layer. The light emitting layer and the cathode layer are sequentially disposed on the fifth insulating layer and the PS layer.

The substrate 10 is a flexible substrate or a glass substrate.

The first insulating layer 20 is a buffer layer, which can be a silicon nitride layer or a silicon dioxide layer. The first insulating layer 20 is deposited on the substrate 10 using chemical vapor deposition.

The polycrystalline silicon layer 30 has an undoped region located at a central portion, and doped regions located at two sides of the undoped region.

The second insulating layer 40 is a separating layer, which can be a silicon nitride layer or a silicon dioxide layer. The second insulating layer 40 is deposited on the polycrystalline silicon layer 30 and the first insulating layer 20 using chemical vapor deposition.

The first gate electrode layer GE1 is made of a transparent conductive metal such as indium tin oxide (ITO).

The third insulating layer 50 is a medium interlayer, which can be a silicon nitride layer or a silicon dioxide layer. The third insulating layer 50 is deposited on the first gate electrode layer GE1 and the second insulating layer 40 using chemical vapor deposition.

The SD metal layer 60 is made of a transparent conductive metal such as indium tin oxide (ITO). The SD metal layer 60 forms a source electrode 61, a drain electrode 62, and a first metal member 63 that are separated from each other. The first metal member 63 faces the first gate electrode layer GE1 to form a first compensating capacitor therebetween.

The fourth insulating layer 70 and the fifth insulating layer 90 can be a silicon nitride layer or a silicon dioxide layer and are formed by deposition using chemical vapor deposition.

The anode metal layer 80 is made of a transparent conductive metal such as indium tin oxide (ITO). The anode metal layer 80 includes the anode metal 81 and the second metal member 82 that are separated from each other. The second metal member 82 faces the first metal member to form a second compensating capacitor C2 therebetween.

A drain electrode via 54 and a source electrode via 55 are disposed in the second insulating layer and the third insulating layer. The source electrode of the SI) metal layer is electrically connected to the polycrystalline silicon layer through the source electrode via 55. The drain electrode of the SD metal layer is electrically connected to the polycrystalline silicon layer through the drain electrode via 54. An anode via 71 is disposed in the fourth insulating layer. The anode metal layer is electrically connected to the SD metal layer through the anode via 71. The fifth insulating layer is perforated to form a first via. The light emitting layer is electrically connected to the anode metal layer through the first via.

Figure 3:
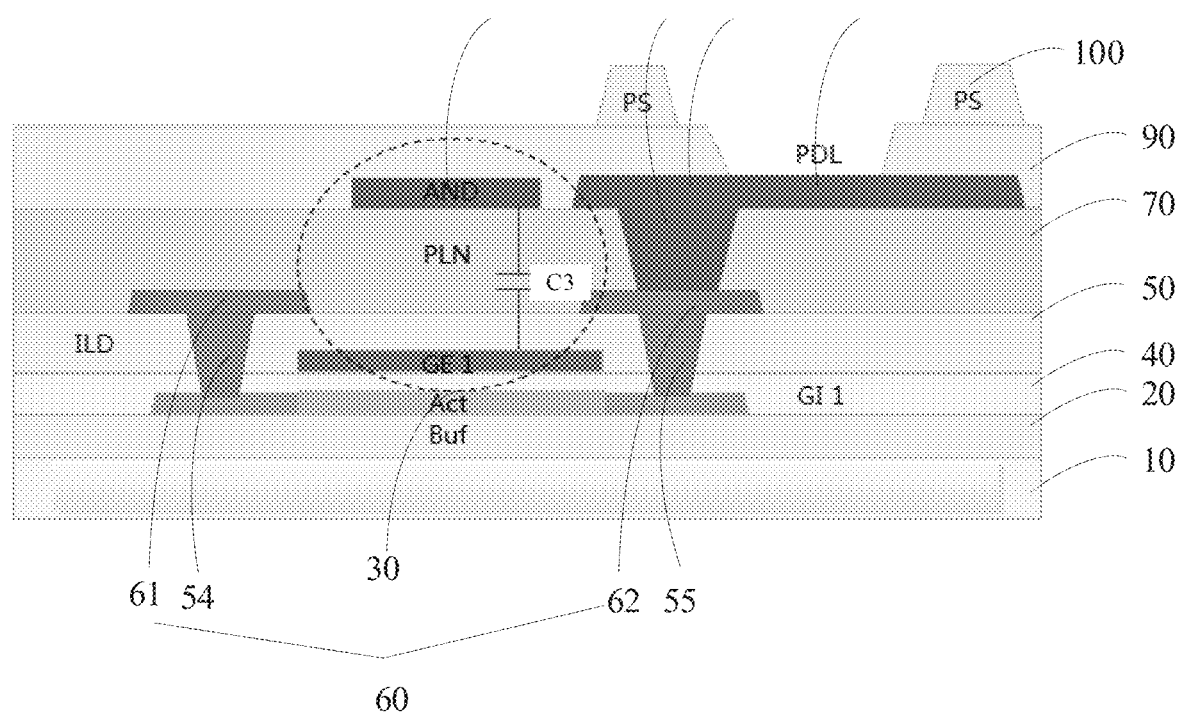
FIG. 3 is a structural diagram showing an AMOLED display according to the present disclosure.

FIG. 3 is a structural diagram showing an OLED display panel according to some embodiments of the present disclosure. The OLED display panel includes a substrate 10, a first insulating layer 20, a polycrystalline silicon layer 30, a second insulating layer 40, a first gate electrode layer GE1, a third insulating layer 50, a SD metal layer 60, a fourth insulating layer 70, an anode metal layer 80, a fifth insulating layer 90, a photoresist spacer (PS) layer 100, a light emitting layer (not shown), and an cathode layer (not shown).

The first insulating layer 20 is disposed on the substrate 10. The polycrystalline silicon layer 30 is disposed on the first insulating layer 20. The second insulating layer 40 is disposed on the polycrystalline silicon layer 30 and the first insulating layer. The first gate electrode layer GE1 is disposed on the second insulating layer 40. The third insulating layer 50 is disposed on the first gate electrode layer GE1 and the second insulating layer 40. The SD metal layer 60 is disposed on the third insulating layer 50. The fourth insulating layer 70 is disposed on the SD metal layer 60 and the third insulating layer 50. The anode metal layer 80 is disposed on the fourth insulating layer 70. The fifth insulating layer 90 is disposed on the anode metal layer 80 and the fourth insulating layer 70. The PS layer is disposed on the fifth insulating layer. The light emitting layer and the cathode layer are sequentially disposed on the fifth insulating layer and the PS layer.

The substrate 10 is a flexible substrate or a glass substrate.

The first insulating layer 20 is a buffer layer, which can be a silicon nitride layer or a silicon dioxide layer. The first insulating layer 20 is deposited on the substrate 10 using chemical vapor deposition.

The polycrystalline silicon layer 30 has an undoped region located at a central portion, and doped regions located at two sides of the undoped region.

The second insulating layer 40 is a separating layer, which can be a silicon nitride layer or a silicon dioxide layer. The second insulating layer 40 is deposited on the polycrystalline silicon layer 30 and the first insulating layer 20 using chemical vapor deposition.

The first gate electrode layer GE1 is made of a transparent conductive metal such as indium tin oxide (ITO).

The third insulating layer 50 is a medium interlayer, which can be a silicon nitride layer or a silicon dioxide layer. The third insulating layer 50 is deposited on the first gate electrode layer GE1 and the second insulating layer 40 using chemical vapor deposition.

The SD metal layer 60 is made of a transparent conductive metal such as indium tin oxide (ITO). The SD metal layer 60 forms a source electrode 61 and a drain electrode 62 that are separated from each other.

The fourth insulating layer 70 and the fifth insulating layer 90 can be a silicon nitride layer or a silicon dioxide layer and are formed by deposition using chemical vapor deposition.

The anode metal layer 80 is made of a transparent conductive metal such as indium tin oxide (ITO). The anode metal layer 80 includes the anode metal 81 and the second metal member 82 that are separated from each other. The first gate electrode layer GE1 faces the second metal member to form a third compensating capacitor C3 therebetween.

A drain electrode via 54 and a source electrode via 55 are disposed in the second insulating layer and the third insulating layer. The source electrode of the SD metal layer is electrically connected to the polycrystalline silicon layer through the source electrode via 55. The drain electrode of the SD metal layer is electrically connected to the polycrystalline silicon layer through the drain electrode via. An anode via 71 is disposed in the fourth insulating layer. The anode metal layer is electrically connected to the SD metal layer through the anode via 71. The fifth insulating layer is perforated to form a first via. The light emitting layer is electrically connected to the anode metal layer through the first via.

The present disclosure provides an OLED display. The OLED display includes an OLED display panel in any of above-described embodiments.

In the present disclosure, the first gate electrode layer faces a part of the SD metal layer and/or a part of the anode metal layer to form a compensating capacitor therebetween. Accordingly, it does need two gate electrode layers to form the compensating capacitor. The present disclosure is beneficial in a reduction in process flow.

The OLED display panel and the OLED display that are provided in the embodiments of the present disclosure are described in detail in the preceding. A principle and an implementation manner of the present disclosure are described in this specification through specific examples. The preceding description of the embodiments is merely used for helping understand the present disclosure. Meanwhile, Persons of ordinary skill in the art may make variations to the specific implementation manner and application scope according to the idea of the present disclosure. In conclusion, contents of this specification shall not be construed as a limitation to the present disclosure.

What is claimed is:

1. An organic light emitting diode (OLED) display panel, comprising a substrate, and a first gate electrode layer, a source drain (SD) metal layer, and an anode metal layer that are disposed on the substrate, wherein the SD metal layer forms a source electrode, a drain electrode, and a first metal member that are separated from each other, and the first metal member faces the first gate electrode layer to form a first compensating capacitor therebetween, wherein the OLED display panel further comprises a first insulating layer, a second insulating layer, a polycrystalline silicon layer, a third insulating layer, a fourth insulating layer, and a fifth insulating layer;

the first insulating layer is disposed on the substrate, the polycrystalline silicon layer is disposed on the first insulating layer, and the second insulating layer is disposed on the polycrystalline silicon layer and the first insulating layer;

the first gate electrode layer is disposed on the second insulating layer, the third insulating layer is disposed on the first gate electrode layer and the second insulating layer, the SD metal layer is disposed on the third insulating layer, the fourth insulating layer is disposed on the SD metal layer and the third insulating layer, the anode metal layer is disposed on the fourth insulating layer, and the fifth insulating layer is disposed on the anode metal layer and the fourth insulating layer.

2. The OLED display panel according to claim 1, wherein the anode metal layer comprises an anode metal and a second metal member that are separated from each other; the first metal member faces the second metal member to form a second compensating capacitor therebetween.

3. The OLED display panel according to claim 1, wherein a source electrode via and a drain electrode via are disposed in the second insulating layer and the third insulating layer, the source electrode of the SD metal layer is electrically connected to the polycrystalline silicon layer through the source electrode via, and the drain electrode of the SD metal layer is electrically connected to the polycrystalline silicon layer through the drain electrode via.

4. The OLED display panel according to claim 1, wherein an anode via is disposed in the fourth insulating layer, and the anode metal layer is electrically connected to the SD metal layer through the anode via.

5. The OLED display panel according to claim 1, wherein the fifth insulating layer is perforated to form a first via;

the OLED display panel further comprises a light emitting layer and a cathode layer;

the light emitting layer is disposed on the fifth insulating layer and the cathode layer is disposed on the light emitting layer;

the light emitting layer is electrically connected to the anode metal layer through the first via.

6. The OLED display panel according to claim 1, wherein the first insulating layer, the second insulating layer, the third insulating layer, the fourth insulating layer, and the fifth insulating layer are a silicon dioxide layer or a silicon nitride layer.

7. An organic light emitting diode (OLED) display panel, comprising a substrate, and a first gate electrode layer, a source drain (SD) metal layer, and an anode metal layer that are disposed on the substrate, wherein the anode metal layer comprises an anode metal and a metal member that are separated from each other, and the metal member of the anode metal layer faces the gate electrode layer to form a compensating capacitor therebetween, wherein the OLED display panel further comprises a first insulating layer, a second insulating layer, a polycrystalline silicon layer, a third insulating layer, a fourth insulating layer, and a fifth insulating layer;

the first insulating layer is disposed on the substrate, the polycrystalline silicon layer is disposed on the first insulating layer, and the second insulating layer is disposed on the polycrystalline silicon layer and the first insulating layer;

the first gate electrode layer is disposed on the second insulating layer, the third insulating layer is disposed on the first gate electrode layer and the second insulating layer, the SD metal layer is disposed on the third insulating layer, the fourth insulating layer is disposed on the SD metal layer and the third insulating layer, the anode metal layer is disposed on the fourth insulating layer, and the fifth insulating layer is disposed on the anode metal layer and the fourth insulating layer.

8. The OLED display panel according to claim 7, wherein a source electrode via and a drain electrode via are disposed in the second insulating layer and the third insulating layer, the source electrode of the SD metal layer is electrically connected to the polycrystalline silicon layer through the source electrode via, and the drain electrode of the SD metal layer is electrically connected to the polycrystalline silicon layer through the drain electrode via.

9. The OLED display panel according to claim 7, wherein an anode via is disposed in the fourth insulating layer, and the anode metal layer is electrically connected to the SD metal layer through the anode via.

10. The OLED display panel according to claim 7, wherein the fifth insulating layer is perforated to form a first via;

the OLED display panel further comprises a light emitting layer and a cathode layer;

the light emitting layer is disposed on the fifth insulating layer and the cathode layer is disposed on the light emitting layer;

the light emitting layer is electrically connected to the anode metal layer through the first via.

11. The OLED display panel according to claim 7, wherein the first insulating layer, the second insulating layer, the third insulating layer, the fourth insulating layer, and the fifth insulating layer are a silicon dioxide layer or a silicon nitride layer.

12. An organic light emitting diode (OLED) display, comprising an OLED display panel, the OLED display panel comprising:

a substrate, and a first gate electrode layer; a source drain (SD) metal layer, and an anode metal layer that are disposed on the substrate; wherein the SD metal layer forms a source electrode, a drain electrode, and a first metal member that are separated from each other, and the first metal member faces the first gate electrode layer to form a first compensating capacitor therebetween, wherein the OLED display panel further comprises a first insulating layer, a second insulating layer, a polycrystalline silicon layer, a third insulating layer, a fourth insulating layer, and a fifth insulating layer;

the first insulating layer is disposed on the substrate, the polycrystalline silicon layer is disposed on the first insulating layer, and the second insulating layer is disposed on the polycrystalline silicon layer and the first insulating layer;

the first gate electrode layer is disposed on the second insulating layer, the third insulating layer is disposed on the first gate electrode layer and the second insulating layer, the SD metal layer is disposed on the third insulating layer, the fourth insulating layer is disposed on the SD metal layer and the third insulating layer, the anode metal layer is disposed on the fourth insulating layer, and the fifth insulating layer is disposed on the anode metal layer and the fourth insulating layer.

13. The OLED display according to claim 12, wherein the anode metal layer comprises an anode metal and a second metal member that are separated from each other; the first metal member faces the second metal member to form a second compensating capacitor therebetween.

* * * * *